US006747249B2

(12) United States Patent
Robinson et al.

(10) Patent No.: US 6,747,249 B2
(45) **Date of Patent: *Jun. 8, 2004**

(54) SYSTEM FOR PERFORMING THERMAL REFLOW OPERATIONS UNDER HIGH GRAVITY CONDITIONS

(75) Inventors: Karl M. Robinson, Boise, ID (US); David L. Chapek, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 10/446,381

(22) Filed: May 27, 2003

(65) Prior Publication Data

US 2003/0192870 A1 Oct. 16, 2003

Related U.S. Application Data

(63) Continuation of application No. 10/118,361, filed on Apr. 8, 2002, now Pat. No. 6,573,478, which is a continuation of application No. 09/903,291, filed on Jul. 11, 2001, now Pat. No. 6,414,275, which is a continuation of application No. 09/626,656, filed on Jul. 27, 2000, now Pat. No. 6,288,367, which is a continuation of application No. 08/724,048, filed on Sep. 17, 1996, now Pat. No. 6,096,998.

(51) Int. Cl.[7] .......................... C23C 16/00; B05D 3/06; F27B 5/10; F27B 9/16

(52) U.S. Cl. ........................ 219/389; 219/411; 118/730

(58) Field of Search ................................ 219/389, 392, 219/393, 411; 392/418; 427/553, 557; 118/50.2, 728, 730, 503; 438/795–797

(56) References Cited

U.S. PATENT DOCUMENTS

| | | | | | |
|---|---|---|---|---|---|
| 2,768,098 | A | * | 10/1956 | Hoppe | 118/730 |
| 2,885,997 | A | * | 5/1959 | Schwindt | 118/730 |
| 3,460,510 | A | | 8/1969 | Currin | |
| 3,645,230 | A | | 2/1972 | Hugle et al. | |
| 3,699,917 | A | | 10/1972 | Deverse et al. | |
| 3,719,166 | A | | 3/1973 | Gereth | |
| 3,865,072 | A | * | 2/1975 | Kirkman | 118/663 |
| 4,597,986 | A | * | 7/1986 | Scapple et al. | 427/582 |
| 4,615,294 | A | * | 10/1986 | Scapple et al. | 118/50.1 |
| 4,772,356 | A | * | 9/1988 | Schumaker et al. | 117/89 |
| 5,053,247 | A | | 10/1991 | Moore | |
| 5,387,557 | A | | 2/1995 | Takagi | |
| 5,445,973 | A | * | 8/1995 | Hedstrom | 438/95 |
| 5,635,241 | A | * | 6/1997 | Abe | 427/240 |
| 5,855,970 | A | * | 1/1999 | Inushima et al. | 427/579 |
| 6,096,998 | A | | 8/2000 | Robinson et al. | |
| 6,174,761 | B1 | | 1/2001 | Robinson et al. | |
| 6,288,367 | B1 | | 9/2001 | Robinson et al. | |
| 6,414,275 | B2 | | 7/2002 | Robinson et al. | |
| 6,573,478 | B2 | | 6/2003 | Robinson et al. | |

* cited by examiner

*Primary Examiner*—Joseph Pelham
(74) *Attorney, Agent, or Firm*—TraskBritt

(57) ABSTRACT

A thermal reflow processing system has a rotatable structure to which articles having a reflowable surface are attached. The structure is coupled to a drive motor which causes the structure to rotate at speeds which generate centripetal forces in excess of that of gravity. The system is equipped with at least one radiant heat source. As the articles are being subjected to a centripetal force, the surface is heated by the radiant heat source.

17 Claims, 3 Drawing Sheets

SYSTEM FOR PERFORMING THERMAL REFLOW OPERATIONS UNDER HIGH GRAVITY CONDITIONS

CROSS-REFERENCE TO RELATED APPLICATIONS

This application is a continuation of application Ser. No. 10/118,361, filed Apr. 8, 2002, now U.S. Pat. No. 6,573,478, issued Jun. 3, 2003, which is a continuation of application Ser. No. 09/903,291, filed Jul. 11, 2001, now U.S. Pat. No. 6,414,275, issued Jul. 2, 2002, which is a continuation of application Ser. No. 09/626,656, filed Jul. 27, 2000, now U.S. Pat. No. 6,288,367, issued Sep. 11, 2001, which is a continuation of application Ser. No. 08/724,048, filed Sep. 17, 1996, now U.S. Pat. No. 6,096,998, issued Aug. 1, 2000.

BACKGROUND OF THE INVENTION

1. Field of the Invention

This invention relates to integrated circuit processing and, more particularly, to rapid thermal processing and reflow operations.

2. State of the Art

As semiconductor device dimensions become increasingly finer, certain traditional integrated circuit manufacturing techniques have become increasingly ineffective. For example, contacts through a dielectric layer have long been made by etching vias through the dielectric layer and then filling the vias with metal deposited via chemical vapor deposition or sputtering methods. With each new generation of integrated circuit, the aspect ratio the opening has typically decreased. As a consequence of this trend, it has become increasingly difficult to completely fill contact vias within integrated circuits of recent manufacture with deposited metal. If contact vias are not completely filled with metal, contact with an underlying conductive layer or junction may fail, thus rendering the integrated circuit nonfunctional.

Another problem related to small device geometries is that of decreasing depth of focus range during photoresist exposure to radiation at the high-frequency end of the UV band. Excessive topographical surface variations can lead to varying degrees of exposure at different focus levels. Out of focus features may not print at all, which may result in nonfunctional circuitry. Therefore, wafers are often planarized prior to photoresist deposition and exposure in order to increase circuit quality.

Still another problem related to shrinking device dimensions is that of void formation between elevated features such as parallel word lines during the chemical vapor deposition of a silicon dioxide interlevel dielectric layer.

All of the aforementioned problems can be mitigated by reflowing the deposited material. During reflow, the material is heated to a temperature where it becomes plastically deformable (i.e., flowable). When a metal layer that has been deposited over contact via openings is reflowed, gravity assists in the filling of contact vias as molten metal from the deposited metal layer seeks the lowest level. Likewise, when a silicon dioxide layer is subjected to a reflow step and becomes flowable, voids between elevated features can be eliminated. A further benefit of reflow is the reduction in topographical variations on the wafer's surface. Reflow operations are also used to densify deposited silicon dioxide layers, which tend to be less dense than those which are thermally grown. Such use is unrelated to the decrease in device dimensions.

During the fabrication process, an integrated circuit is subjected on numerous occasions to elevated temperature. Generally, the elevated temperature is required to effect a necessary step in the fabrication process. For example, oxidation of silicon, aluminum metallization, implant activations, chemical vapor deposition of silicon dioxides, and reflow operations are generally performed at temperatures in excess of 500 degrees centigrade. Although a certain amount of exposure to elevated temperatures is required both to activate implanted ions and to cause them to diffuse within the implanted material, excessive exposure to elevated temperature is injurious to integrated circuits. Excessive exposure to elevated temperature is irreversible, and can cause the overlapping and counter-doping of adjacent implants having opposite conductivity types, as well as the diffusion of dopants from source/drain regions of field-effect transistors into the channel regions. The overlapping and counter-doping of opposite, adjacent implants can obliterate junctions. Out-diffusion of dopants into the channel regions can result in transistor leakage. Greater out-diffusion will, at some point, short the source/drain regions of a transistor together and completely destroy the functionality of the circuit. The exposure of integrated circuits to heat is analogous in two respects to the exposure of living organisms to ionizing radiation. Not only is exposure cumulative, but at some exposure level, the organism will die. Each integrated circuit device has an optimum thermal exposure level that is generally referred to as the circuit's thermal budget. Actual thermal exposure levels which either exceed or fall short of the thermal budget may adversely affect circuit performance. The actual thermal exposure level is calculated by summing all individual occurrences of thermal exposure during the fabrication process, each occurrence being a function of both exposure time and exposure temperature. Although thermal exposure with respect to time is a linear function, thermal exposure with respect to temperature is not, as the rate of diffusion increases exponentially with increasing temperature.

As device geometries are shrunk for new generations of integrated circuits, thermal budgets must be lowered by a corresponding amount. Unless the process is modified to reflect these reduced thermal budgets, it will become increasingly difficult to stay within those budgets.

In order to reduce the thermal budget of integrated circuits which are subjected to reflow operations, rapid thermal processing is typically used for such operations. Rapid thermal processing generally involves rapidly and uniformly heating the surface of a semiconductor wafer with a radiant heat source. Infrared lamps are often used for a radiant heat source. Because of thermal budget limitations, circuits can seldom be subjected to rapid thermal processing in conventional systems for a period sufficient to fully solve the problem for which the reflow operation is undertaken, as the characteristic viscosities of the molten materials prevent rapid flow. Thus, a reflow step seldom succeeds in eliminating all topographical variations on the surface of a wafer or in completely filling contact via openings. In order to further reduce topographical variations, further planarization using a chemical etchback, mechanical polishing or chemical mechanical planarization (a combination of chemical etching and mechanical polishing) is generally required. In order to ensure that contact via openings are adequately filled with metal, the openings are typically made larger than the critical dimension (i.e., the smallest printable size) to reduce the effect of viscosity on flow, thus wasting precious wafer real estate.

It is clear that additional advances will be required to maintain the usefulness of reflow operations as device dimensions are reduced still further.

BRIEF SUMMARY OF THE INVENTION

The present invention overcomes the aforementioned limitations of contemporary rapid thermal processing systems through the use of a structure rotatable about an axis of revolution, to which articles having a surface to be reflowed are affixed. The surface to be reflowed is positioned such that it both faces the axis of revolution and is perpendicular to a line passing through and perpendicular to the axis of revolution. As the structure is rotating, the surface of each article affixed to the structure is heated at least to the point of plasticity by a radiant heat source. A single heat source that is concentric with the axis of revolution may be employed for all articles, or each article may be heated by its own heat source positioned between the axis of revolution and that article's surface. In a preferred embodiment, the rotating structure is a hermetically-sealable, cylindrically-walled chamber which can be pressurized to a pressure greater than ambient pressure or evacuated to a pressure less than ambient pressure. Products for which the surface thereof is to be reflowed are positioned on the cylindrical wall of the chamber with the surface to be reflowed facing a heat source. In the case of a circular semiconductor wafer, the wafer is positioned against the cylindrical wall such that the planar surface of the wafer is centered and perpendicular to a radius of the cylindrical chamber. By performing the reflow operation while the chamber is spinning, high pseudo-gravitational forces can be generated which aid in planarization, void elimination, densification and in the filling of small aspect ratio contact via openings.

In a first embodiment of the invention, the chamber axis is oriented such that it is perpendicular to the earth's gravitational force in order to eliminate the downward force component that would favor flow toward a downward facing edge of each wafer within the spinning chamber. In a second embodiment of the invention, the chamber axis is oriented parallel with respect to the earth's gravitational force. However, each wafer is mounted on a rotating platen which rotates slowly during the reflow operation. Ideally, the rate of revolution would be at least one but not more than several revolutions during the operation. The rotation rate is maintained at a very low level in order to minimize the centrifugal force experienced by the molten material toward the edges of the wafer.

DETAILED DESCRIPTION OF THE INVENTION

The present invention represents a significant advancement in rapid thermal reflow processing technology, and particularly as it relates to the processing of integrated circuits. The present invention, by providing greatly increased gravitational loading on processed wafers, is able to greatly reduce thermal exposure during rapid thermal processing and to achieve better contact via fill, and greater densification and more effective planarization of thermally processed layers.

In order to achieve the aforementioned results, a thermal reflow processing system is designed to have a rapidly-spinning, cylindrically-walled, drum-like chamber with a radiant heat source axially centered therein. Products for which the surface thereof is to be reflowed (e.g., semiconductor wafers) are positioned near the chamber wall with the surface to be reflowed facing the heat source. In the case of circular semiconductor wafers, the wafers are positioned such that the planar surface of each wafer is centered on and perpendicular to a radius of the cylindrical chamber. By performing the reflow operation while the chamber is spinning, high pseudo-gravitational forces can be generated which aid in planarization, void elimination, densification and in the filling of small aspect ratio contact via openings.

Liquid flow is governed by the following equation:

$$\rho Dv/Dt = -\nabla P - [\nabla \cdot \tau] + \rho g = -\nabla P + \mu \nabla^2 v + \rho g,$$

where $\rho$ is the density of the molten material;

$Dv/Dt$ is acceleration, which is 0 for steady state;

$\nabla P$ is the pressure force per unit volume (RTP is generally performed at low pressure or in a near vacuum);

$\nabla \cdot \tau$ are temperature-dependent shear stress tensors, which are a matrix of the gradients $\partial/\partial x$, $\partial/\partial y$ and $\partial/\partial z$, which are actually deformation profiles of the molten material in the x, y and z directions;

$\mu$ is viscosity; and g is the gravimetric force.

The relationship $\rho \partial v/\partial t = -\nabla \rho + \mu \nabla^2 v + \rho g$, which is true for constant density and viscosity, is known as the Navier-Stokes equation. The term, $\mu \nabla^2 v$, is the second derivative of v with respect to x, y and z. For this invention, the temperature effect is combined with a high pseudo-gravitational effect, which is generated by the centripetal force applied to the wafers (or other treated objects) by the spinning chamber.

Figure 1:
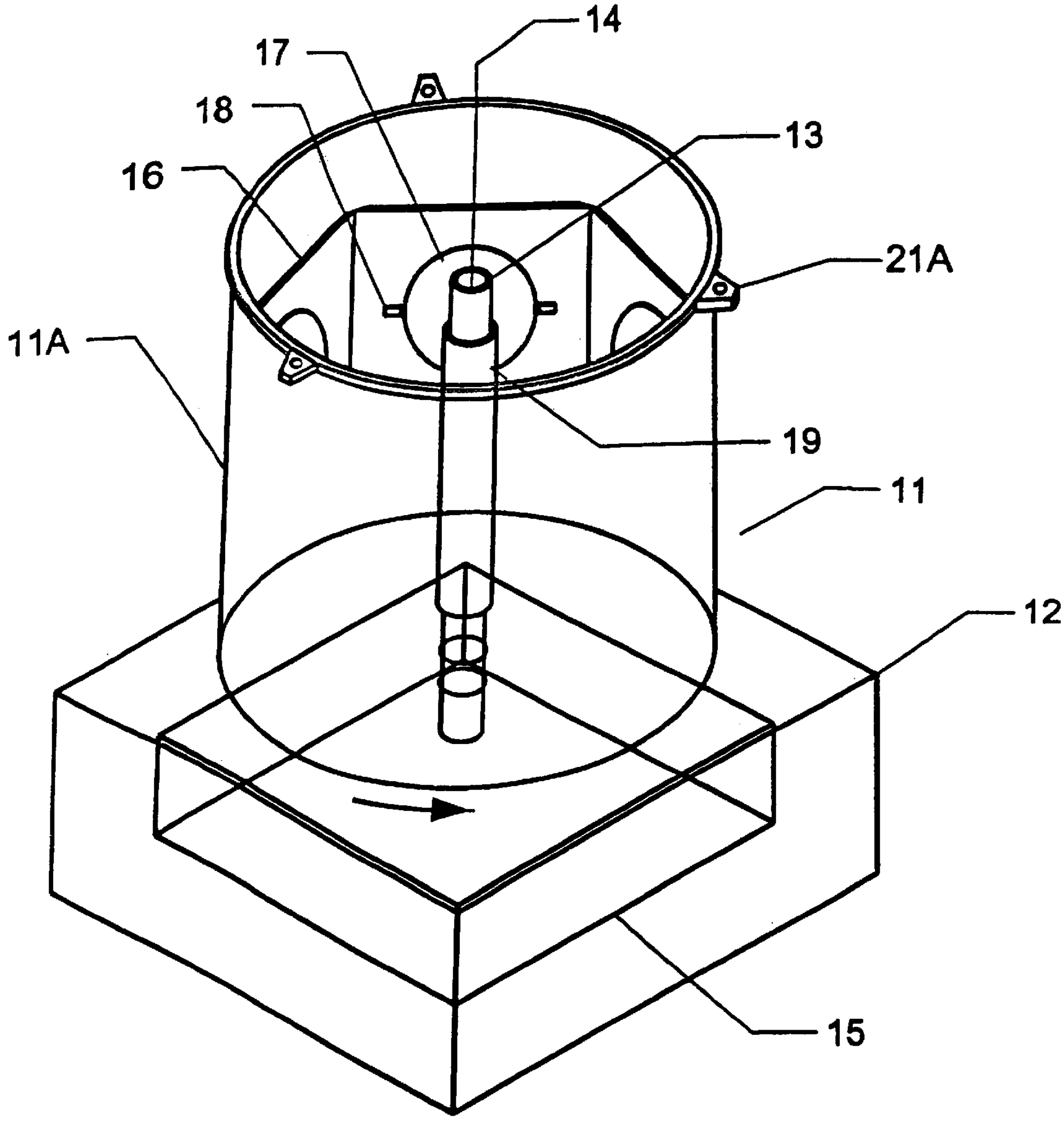
FIG. 1 is a see-through isometric view of a preferred embodiment of the new rapid thermal processing system with the upper chamber portion removed.
Figure 2:
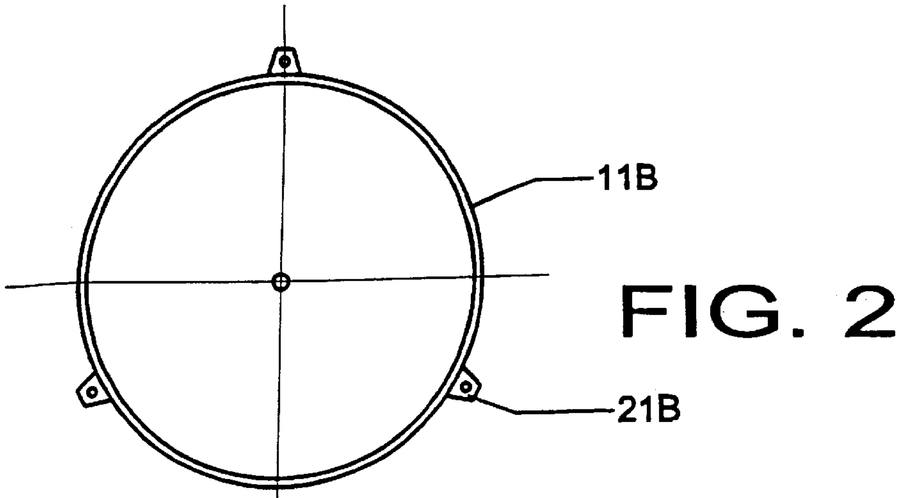
FIG. 2 is a top-plan view of the upper chamber portion.
Figure 2A:
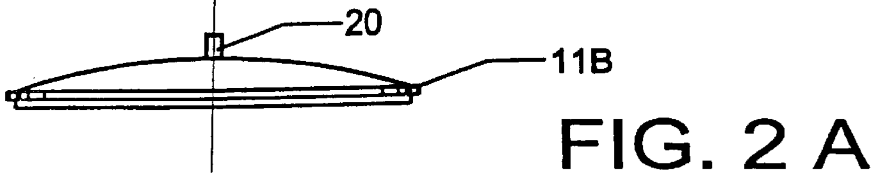
FIG. 2A is a side elevational view of the upper chamber portion.

Referring now to FIG. 1, the new rapid thermal processing system is depicted in a see-through drawing. A drum-like chamber 11, which is comprised of a cylindrical-bucket-shaped lower portion 11A and a removable lid-like upper portion 11B (see FIGS. 2 and 2A), is affixed to a base 12 via a rotating shaft 13 which coincides with the central rotational axis 14 of the chamber 11. The rotating shaft 13 is powered by a drive motor assembly 15. Rotational movement is imparted to the chamber by the drive motor assembly 15 via the rotating shaft 13. A plurality of planar wafer mounting fixtures 16 is attached to the wall of the chamber lower portion 11A. Each wafer 17 is affixed to its respective planar wafer mounting fixture 16 via clamps or clips 18 or an electrostatic chuck (not shown). A radiant heat source 19 is positioned within the chamber 11 coincident with the chamber's central, rotational axis 14, such that it is equidistant from each wafer 17 within the chamber 11. The lid-like upper chamber portion 11B, which may be clamped to the lower chamber portion 11A prior to rotatably powering the chamber 11, may also be removed in order to provide access for the loading and unloading of wafers 17 within the lower chamber portion 11A. With the lid-like upper chamber portion 11B clamped to the lower chamber portion 11A using tightenable fasteners (e.g., threaded bolts), which pass through the holes within the three ears 21A on the lower chamber portion 11A and also the holes in the matching three ears 21B on the upper chamber portion 11B, the chamber is hermetically sealable and may be evacuated or pressurized through a pressure line connection and valve assembly 20.

Figure 3:
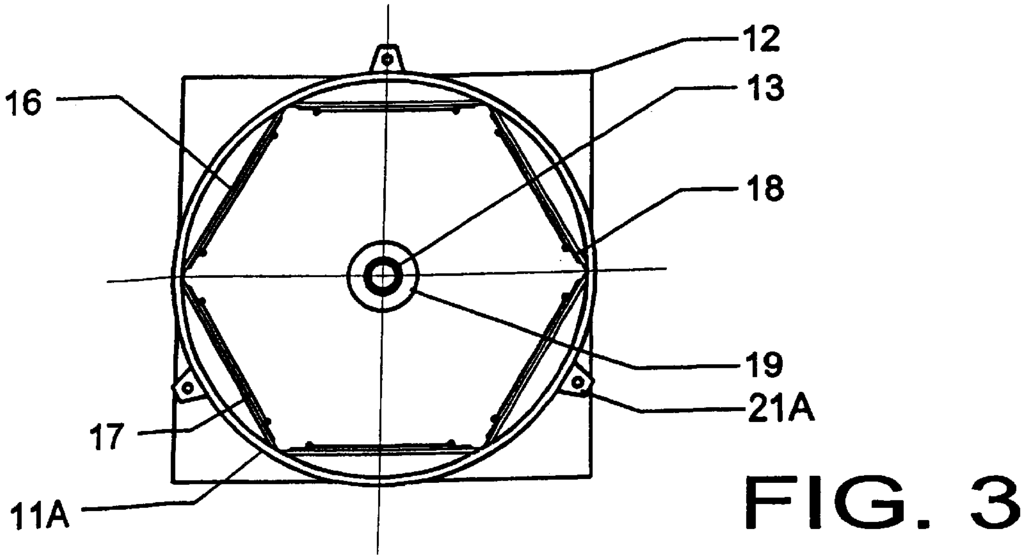
FIG. 3 is a top plan view of a first embodiment of the lower chamber portion and base.

Referring now to the top-view of the new rapid thermal processing system depicted in FIG. 3, six semiconductor wafers 17 are shown affixed to the inner wall of the lower chamber portion 11A. As previously explained, each wafer is positioned such that the planar surface of each wafer is centered on and perpendicular to a radius of the cylindrical chamber. The radiant heat source 19, which is centered on the chamber's rotational axis 14 (FIG. 1), may be any one of a number of commercially available radiant heat sources, such as an infrared lamp, resistance wiring (e.g., nickel-chromium) heating elements, or ceramic-core heating elements.

Figure 4:
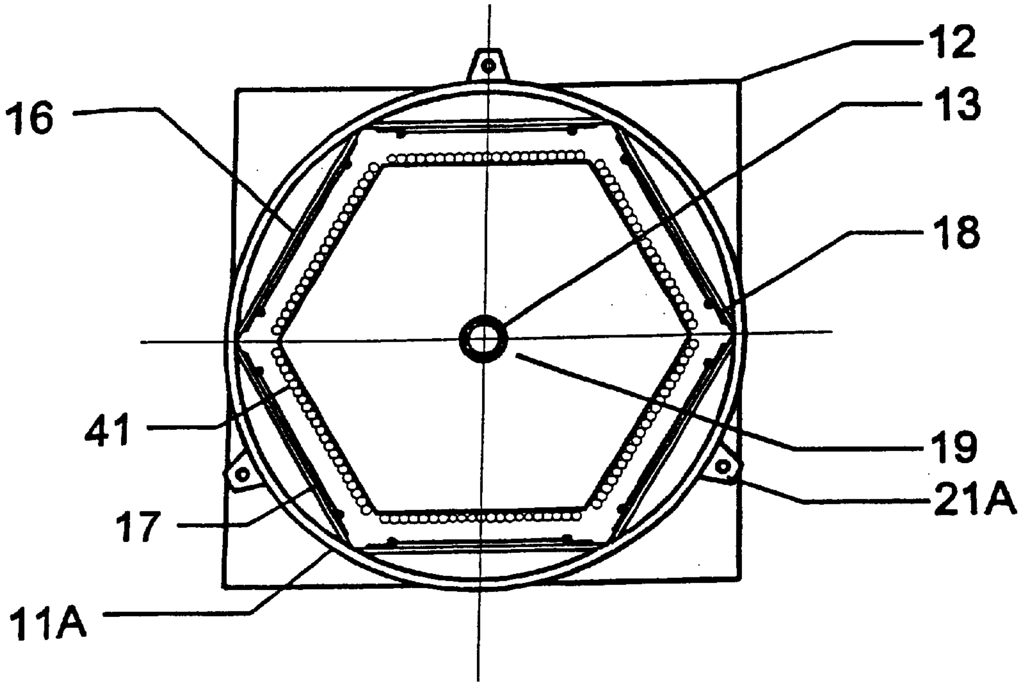
FIG. 4 is a top plan view of a second embodiment of the lower chamber portion and base.

Referring now to the top view of an alternative embodiment depicted in FIG. 4, a radiant heat source 41 is provided for each wafer 17. Once again, each source may consist of a battery of infrared lamps, resistance wiring, or ceramic-core heating elements.

The present invention also includes the steps of a process for reflowing the surface of an article of manufacture such as a semiconductor wafer, the article having an upper surface which becomes plastically deformable upon heating. The process includes the steps of: subjecting the article of manufacture to a centripetal force that is perpendicular to and out of the surface along a single line (the line preferably running through a center point of the surface); heating the surface to a temperature sufficient to render the surface plastically deformable while the wafer is being subjected to the centripetal force; and cooling the surface to a temperature sufficiently low that the surface reverts to a stable state that is not plastically deformable while the wafer is being subjected to the centripetal force.

The method is implemented in conjunction with the apparatus of FIG. 1 by loading a wafer 17 on a rotatable structure such as the rotatable chamber 11; imparting rotational movement to the structure at a rate of revolution calculated to produce a desired pseudo-gravitational effect; uniformly heating material on the surface of the wafer while the structure is spinning, thus allowing the heated material to plastically deform; allowing the heated material to cool to a stable state while the structure is still rotating; halting the rotational movement of the structure; and removing the wafer from the rotatable structure.

One of the problems associated with the current thermal processing system is that the magnitude and direction of the centripetal force experienced by different parts of the wafer varies. This is because portions of the wafer farther removed from a line coplanar to the surface of the wafer and passing through the center of the wafer and parallel to the chamber's rotational axis 14 experience a greater centripetal force than those portions on the line, as their radius of revolution is greater than those portions on the line. In addition, because the surface of the wafer is not curved, the centripetal force acts perpendicular to the surface only along a line where it is perpendicular to radii of revolution. Centripetal force experienced by a point on the wafer, in terms of gravitational force equivalents g, is governed by the following equation from *Perry 's Chemical Engineering Handbook:*

$g=(5.5\times10^{-5})n^2d$, where n=chamber speed in revolutions per minute; and d=chamber diameter in centimeters.

Thus, for those portions of the wafer not on the line, there is a lateral component which tends to displace molten material on the surface of the wafer in a direction away from the line. This effect can be more easily comprehended by the extreme example where the wafer coincides with the chamber's rotational axis. In such a location, there is no centripetal force perpendicular to the wafer's surface. Instead, the direction of the centripetal force is parallel to the wafer's surface and directed perpendicularly from the center line of the wafer that is parallel to the rotational axis 14. These effects can be mitigated by having a chamber with a radius of revolution that is large compared to the diameter of the wafer. When, for example, the wafer diameter is less than one-half the chamber's radius of revolution at the center of the wafer, the differential effect is sufficiently minimal for most integrated circuit manufacturing processes. The effect can be further mitigated by slowly rotating the wafer (at least one complete turn) about its central axis as reflow processing proceeds. The mechanisms for imparting such rotating motion are not depicted, as there are many ways of implementing such a rotating wafer support. Using such a technique, process variation is further minimized, and is at least concentrically distributed on the surface of the wafer.

Thus, it should be readily apparent from the above description that improved reflow processing may be accomplished with the disclosed apparatus using the disclosed method.

Although only several embodiments of the apparatus and method for improved reflow processing are disclosed herein, it will be obvious to those having ordinary skill in the art that changes and modifications may be made thereto without departing from the scope and the spirit of the invention as hereinafter claimed. For example, a reflow system may be designed which does not have a rotating chamber. A rotating structure may be designed for supporting the articles having a surface to be reflowed. The rotating structure may then be enclosed within a hermetically sealable chamber. The disadvantage of such an arrangement is that for pressurized operation, rotation of the articles within the pressurized environment may cause uneven flow patterns because of flow resistance generated as the structure spins in the pressurized environment. For operations in a near vacuum, such a system and that of the disclosed preferred embodiment would have similar performance. The use of a spinning, hermetically sealable chamber provides greater flexibility of operation and permits the manufacture of a less complex apparatus.

What is claimed is:

1. An apparatus for thermally processing a portion of a surface of an article comprising:

a chamber having an axis of revolution, having at least one radius of revolution, having a shaft, having a removable lid, having an interior chamber wall, and having a mounting fixture attached to said interior chamber wall of said chamber for attaching said article having said portion of said surface for the thermal processing thereof, said article being attachable to said mounting fixture having said portion of said surface thereof positioned perpendicularly to said at least one radius of revolution of said chamber;

a drive assembly connected to said shaft of said chamber for rotating said chamber; and a radiant heat source used to heat said portion of said surface of said article attached to said mounting fixture, said radiant heat source positioned between said article attached to said mounting fixture and said axis of revolution of said chamber.

2. The apparatus of claim 1, wherein said chamber includes a hermetically sealable chamber.

3. The apparatus of claim 2, wherein said chamber further comprises a pressure line connection used to evacuate said chamber to a pressure less than ambient atmospheric pressure.

4. The apparatus of claim 2, wherein said chamber includes a pressure line connection used to pressurize said chamber to a pressure greater than ambient atmospheric pressure.

5. An apparatus for thermally processing a portion of a surface of an article comprising:

chamber apparatus having an axis of revolution, having at least one radius of revolution, having a shaft connected thereto, and having at least one mounting fixture attached to a portion of said article, said portion of said surface of said article positioned perpendicularly to said at least one radius of revolution of said chamber apparatus;

a drive apparatus connected to said shaft of said chamber apparatus; and a radiant heat source centered about said axis of revolution of said chamber apparatus for heating said portion of said surface of said article.

6. The apparatus of claim 5, wherein said radiant heat source comprises at least one infrared lamp.

7. The apparatus of claim 5, wherein said radiant heat source comprises one of a resistance wiring element and a ceramic-core heating element.

8. The apparatus of claim 5, wherein said chamber apparatus generates a centripetal force that is greater than that of one of gravity at sea level during rotation thereof and centripetal forces within a range of 10 to 1000 times the force of gravity at sea level during rotation thereof.

9. An apparatus for thermally processing a portion of a surface of an article comprising:

chamber apparatus having an axis of revolution, having a radius of revolution, having a shaft, and having at least one mounting location therein for mounting said article for the thermally processing said portion of said surface, said article mounted having said portion of said surface positioned facing said axis of revolution at said radius of revolution and mounted perpendicularly to said radius of revolution, said chamber apparatus comprising a hermetically sealable chamber;

a drive assembly connected to said shaft of said chamber apparatus; and a radiant heat source used to heat said portion of said surface of said article mounted at said at least one mounting location.

10. The apparatus of claim 9, wherein said radiant heat source is positioned between said mounted article and said axis of revolution.

11. The apparatus of claim 9, wherein said at least one mounting location is used to mount at least one semiconductor wafer.

12. The apparatus of claim 11, wherein said at least one semiconductor wafer has a diameter that is less than one-half of said radius of revolution of said chamber apparatus at a center of said at least one semiconductor wafer.

13. A system for thermally processing a portion of a surface of an article comprising:

a chamber having an axis of revolution, having a radius of revolution, having a shaft, and having at least one mounting location therein for mounting said article for thermally processing said portion of said surface thereof, said article for mounting having said portion of said surface positioned such that it faces said axis of revolution at said radius of revolution and for mounting perpendicularly to said radius of revolution, said chamber comprising a hermetically sealable rotatable chamber;

a drive assembly connected to said shaft of said chamber for rotating said chamber; and a radiant heat source used to heat said portion of said surface of said article mounted at said at least one mounting location.

14. The system of claim 13, wherein said chamber includes a pressure line connection used for at least one of evacuating said chamber to a pressure less than ambient atmospheric pressure and evacuating said chamber to a pressure greater than ambient atmospheric pressure.

15. An apparatus for thermally processing a portion of a surface of an article comprising:

a chamber having an axis of revolution, having a radius of revolution, having a shaft, and having at least one mounting location for mounting said article having said portion of said surface, said article for mounting having said portion of said surface to be positioned facing said axis of revolution at said radius of revolution of said chamber and for mounting perpendicularly to said radius of revolution, said chamber generating centripetal forces within a range of 10 to 1000 times a force of gravity at sea level;

a drive apparatus connected to said shaft of said chamber for rotating said chamber; and a radiant heat source having an axis concentric with said axis of revolution for heating said portion of said surface of said article.

16. The apparatus of claim 15, wherein said radiant heat source comprises at least one of an infrared lamp and at least one ceramic-core heating element.

17. The apparatus of claim 16, wherein said infrared lamp comprises at least one resistance wiring element.

* * * * *

UNITED STATES PATENT AND TRADEMARK OFFICE

CERTIFICATE OF CORRECTION

PATENT NO. : 6,747,249 B2
APPLICATION NO. : 10/446381
DATED : June 8, 2004
INVENTOR(S) : Karl M. Robinson and David L. Chapek It is certified that error appears in the above-identified patent and that said Letters Patent is hereby corrected as shown below:

<u>Column 1,</u>
Line 32, insert -- of vias (i.e., the ratio of depth to width) has typically increased while the cross-sectional area of -- between “ratio” and “the”.

<u>Column 5,</u>
Line 60, change “g” to -- *g* --.
Line 62, change “$g=(5.5x10^{-5})n^2d$” to -- $g=(5.5x10^{-5})n^2d$ --.
Line 63, change “n” to -- *n* --.
Line 64, change “d” to -- *d* --.

Signed and Sealed this

Twentieth Day of June, 2006

JON W. DUDAS
*Director of the United States Patent and Trademark Office*